United States Patent [19]

Nishimura et al.

[11] Patent Number: 5,130,223
[45] Date of Patent: Jul. 14, 1992

[54] POSTIVE WORKING IMAGE-FORMING MATERIAL WITH SURFACE ROUGHENED PLASTIC FILM SUBSTRATE, TRANSPARENT RESIN LAYER, COLORED RESIN LAYER AND PHOTOSENSITIVE RESIN LAYER

[75] Inventors: Kaoru Nishimura, Urawa; Toshimichi Katsuoka, Tokyo; Yasunori Sugiyama, Urawa, all of Japan

[73] Assignee: Kimoto & Co., Ltd., Japan

[21] Appl. No.: 493,445

[22] Filed: Mar. 14, 1990

[30] Foreign Application Priority Data

Mar. 17, 1989 [JP] Japan .................................. 1-65345

[51] Int. Cl.⁵ ...................... G03F 7/023; G03C 1/76; G03C 1/91
[52] U.S. Cl. .................................. 430/166; 430/271; 430/326
[58] Field of Search ................. 430/166, 143, 145, 271

[56] References Cited

U.S. PATENT DOCUMENTS

| | | | |
|---|---|---|---|
| 4,268,601 | 5/1981 | Namiki et al. | 430/166 |
| 4,396,700 | 8/1983 | Kitajima et al. | 430/143 |
| 4,803,145 | 2/1989 | Suzuki et al. | 430/166 |
| 4,987,048 | 1/1991 | Shinozaki et al. | 430/166 |

*Primary Examiner*—Charles L. Bowers, Jr.
*Assistant Examiner*—Christopher G. Young
*Attorney, Agent, or Firm*—Lorusso & Loud

[57] ABSTRACT

Disclosed herein are an image-forming material and a process for forming images. Which can be applied to second originals used in the field of designing and drawing.

The image-forming material comprises a roughened plastics film substrate and a transparent resin layer, colored resin layer, and photosensitive resin layer formed one over another (in the order mentioned) on the roughened surface of the substrate, said three layers being so designed as to be removed completely by dissolution or swelling during development after exposure to active rays. It permits the formation of a colored relief image without any dyeing step and gives rise to a good image free of base fogging without causing any decrease in printing sensitivity.

The process for forming images comprises exposing the above-mentioned image-forming material to active rays and subsequently developing the exposed image-forming material with two kinds of developing solutions consecutively, thereby forming a colored positive relief image on the roughened plastics film substrate, said development causes the exposed parts of the transparent resin layer, colored resin layer, and photosensitive resin layer to be removed by dissolution or swelling.

5 Claims, No Drawings

POSITIVE WORKING IMAGE-FORMING MATERIAL WITH SURFACE ROUGHENED PLASTIC FILM SUBSTRATE, TRANSPARENT RESIN LAYER, COLORED RESIN LAYER AND PHOTOSENSITIVE RESIN LAYER

BACKGROUND OF THE INVENTION

1. Field of the Invention

The present invention relates to an image-forming material and a process for forming images. More particularly, it is concerned with an image-forming material and a process for forming images which will be used to make second originals (intermediate, transparent sheets on which original drawings are duplicated) in the field of designing and drawing.

2. Related Art Statement

There have been known image-forming materials and development processes for the production of second originals to be used in the field of designing and drawing. According to the conventional method, the image-forming material is prepared by providing a roughened plastics film substrate with a photosensitive resin layer capable of forming a positive relief. The thus prepared image-forming material undergoes positive printing of an original and subsequent development, so that a colored positive relief image (as a second original) is formed on the roughened plastics film substrate.

One of such known methods is disclosed in Japanese Patent Laid-open No. 133440/1985. According to this disclosure, a plastics film substrate with a roughened surface (matte surface) formed by sandblasting is coated with a photosensitive resin layer composed of a diacetone-acrylamide-acrylamide copolymer and a water-insoluble o-quinonediazide compound. The thus prepared sensitive material undergoes positive printing of an original and subsequent development with an alkaline aqueous solution for the formation of a positive relief image. Finally, the positive relief image is dyed with a black dye solution to give a colored positive relief image having an optical density of 2.5.

Similar image-forming methods to that mentioned above are also disclosed in Japanese Patent Laid-open Nos. 203449/1986 and 163847/1988, except that the diacetoneacrylamide-acrylamide copolymer is replaced by a polyvinylpyrrolidone polymer (in the former) or a water-soluble polyamide resin (in the latter).

The above-mentioned conventional image-forming processes have an advantage of being capable of forming a colored positive relief image of the original drawing on a roughened plastics film substrate. However, they also have a disadvantage that the step of dyeing a positive relief image in the development process stains the operator's body and clothing and the working environment with the dye solution used in that step. This trouble has been alleviated by the introduction of automatic development process. This poses another problem associated with the maintenance of the automatic developing machine and the disposal of the dye waste liquid discharged from the automatic developing machine. To address this problem, there has been proposed a method for forming a colored positive relief image without using a dye solution in the development process. (See the above-mentioned Japanese Patent Laid-open Nos. 133440/1985, 203449/1986, and 163847/1988.)

This method consists of forming a photosensitive resin layer (containing a dye or pigment as an essential coloring component) on a roughened plastics film substrate, exposing the sensitive material for positive printing of the original, and forming a colored positive relief image by development with an alkaline aqueous solution. This method obviates the use of a dye solution in the development process. A disadvantage of this method is that the photosensitive resin layer have to contain a large amount of coloring component (dye or pigment) so that the resulting relief image has a sufficient density required for second originals in the field of designing and drawing. Increasing the amount of the coloring component greatly lowers the printing sensitivity of the photosensitive resin layer, which has to be compensated for by a large amount of exposure in positive printing of the original. A large amount of exposure, in turn, tends to cause the base fogging of non-image area due to the sticking of a dye or pigment (from the photosensitive resin layer) to the roughened plastics film substrate. The base fogging may be reduced by extending development with an alkaline aqueous solution. However, extended development forms pin-holes in images and drops out thin lines.

To reduce the base fogging and to increase adhesion between the roughened plastics film substrate and the photosensitive resin layer, there was proposed a new idea in the above-mentioned Japanese Patent Laid-open No. 133440/1985. According to this idea, a resin layer is interposed between the roughened plastics film substrate and the photosensitive resin layer, said resin layer being made of phenolic resin, polyester resin, urethane resin, vinylidene chloride-vinyl acetate copolymer, or vinylidene chloride-acrylonitrile copolymer. Unfortunately, the resin layer is not effective enough to lower the base fogging sufficiently. Moreover, the resin layer remains on the roughened plastics film substrate even after development, lowering the receptivity of pencil, aqueous ink, or oil-based ink for retouching, or increasing the light transmission and hence decreasing the surface whiteness. (This is because the resin layer hides the rough surface of the film substrate.) Another disadvantage of the resin layer is that it is irregularly removed when a part of image is erased with an organic solvent (such as methyl ethyl ketone) after image forming. This causes uneven surface reflection, degrading the appearance of the second original.

SUMMARY OF THE INVENTION

The above-described drawbacks in the prior art have been successfully eliminated by the present invention.

Accordingly, it is an object of the present invention to provide an image-forming material and a process for forming images which permit the formation of a colored relief image without any dyeing step and which give rise to a good image free of base fogging without causing any decrease in printing sensitivity.

It is another object of the present invention to provide an image-forming material and a process for forming images which can be used for the production of a second original (a duplicate of an original) having a good appearance and retouchability.

The above-mentioned object of the present invention is achieved first by an image-forming material which comprises a roughened plastics film substrate and a transparent resin layer, colored resin layer, and photosensitive resin layer formed one over another (in the order mentioned) on the roughened surface of the substrate, said three layers being so designed as to be removed completely by dissolution or swelling during development after exposure to active rays.

The above-mentioned object of the present invention is achieved secondly by a process for forming images which comprises exposing the above-mentioned image-forming material to active rays and subsequently developing the exposed image-forming material with a first developing solution and a second developing solution consecutively, thereby forming a colored positive relief image on the roughened plastics film substrate, said first developing solution being an aqueous solution having a pH value 10.0 or above and containing a water-miscible organic solvent and/or anionic surface active agent, said second developing solution being an aqueous solution having a pH value lower than 10.0 and containing a water-miscible organic solvent and/or anionic surface active agent.

These and other objects of the invention will become more apparent in the detailed description and examples which follow.

DETAILED DESCRIPTION OF THE INVENTION

The invention will be described in more detail in the following.

The image-forming material of the present invention has a plastics film substrate which is formed by roughening one or both sides of a transparent plastics film such as polyethylene terephthalate film, triacetate film, polycarbonate film, polyvinyl chloride film, polystyrene film, polypropylene film, and polysulfone film. The surface roughening is accomplished by sand blasting, etching, coating, or embossing. The surface roughness is from 0.25 μm to 1.25 μm in terms of Arithmetical mean deviation (Ra, ISO 468-1982 Surface Roughness).

The plastics film substrate should have the above-specified surface roughness so that the image-forming material gives rise to a second original which is receptive to a pencil, aqueous ink, and oil-based ink for retouching after image-forming. If the substrate is smoother than specified above, the second original does not permit good retouching with a pencil or ink (both aqueous and oil-based). In other words, retouches with a pencil will be easily rubbed off due to incomplete fixing and retouches with ink will be light due to insufficient ink transfer. If the substrate is rougher than specified above, the second original does not permit good retouching with a pencil or ink (both aqueous or oil-based). In other words, retouches with a pencil will lack uniform density due to discontinuity and retouches with ink are easily blurred due to blotting.

A preferred example of the roughened plastics film substrate is a transparent polyethylene terephthalate film, with the surface thereof roughened to such an extent that the Arithmetical mean deviation is from 0.25 μm to 1.25 μm. It is superior in mechanical strength, dimensional stability, and chemical resistance. It is prepared by roughening a polyethylene terephthalate film, 50 μm to 200 μm thick, by the surface coating method.

Surface roughening by the surface coating method is achieved by coating one or both sides of the above mentioned polyethylene terephthalate film with a coating composition composed of a binder resin solution and a matting agent. The binder resin solution may be prepared from one or more than one kind of thermoplastic resin and thermosetting resin. The matting agent is selected from extender pigments (such as calcium carbonate, calcium silicate, magnesium silicate, silicon dioxide, clay, and talc), white pigments (such as zinc oxide, titanium oxide, basic lead carbonate, an lithopone), and resin fine particles (such as acrylic resin, styrene resin, epoxy resin, benzoguanamine resin, and silicon resin). The coating thickness (after drying) should be 1 μm to 10 μm.

The above-mentioned coating composition should be made with a resin which is insoluble in or difficulty swellable by the developing solution and the solvent in the solution from which the transparent resin layer is formed. Examples of such a resin include thermoplastic resin (such as saturated polyester resin, vinyl chloride-vinyl acetate copolymer, vinylidene chloride-vinyl chloride copolymer, nitrocellulose, cellulose derivatives, polyvinyl butyral, aldehyde-modified polyvinyl alcohol, and polyamide resin) and thermosetting resins (such as phenolic resin, melamine resin, polyurethane resin, and unsaturated polyester resin).

The above-mentioned coating composition should be composed of the binder resin in an amount of 100 parts by weight and the matting agent in an amount of 10–500 parts by weight, preferably 20–300 parts by weight, so that it gives rise to a roughened plastics film substrate having a light transmittance higher than 40% and the Arithmetical means deviation of 0.25–1.25 μm. Roughened transparent polyester film for drawing produced by the surface coating method is commercially available under the trade name of "Uniper" or "Microtrace" from Kimoto Co., Ltd. It may be advantageously used as the roughened plastics film substrate in the present invention.

The roughened plastics film substrate should preferably undergo surface treatment such as corona discharge treatment for the improvement of adhesion to the transparent resin layer to be formed thereon.

According to the present invention, the roughened plastics film substrate is coated with the transparent resin layer, which is intended to prevent base fogging. It is prepared from a film-forming resin which is insoluble in water but soluble in or swellable by the first and second developing solutions (mentioned later). Examples of such a resin include (meth)acrylic acid-(meth)acrylate ester copolymer, (meth)acrylic acid-2-hydroxyethyl (meth)acrylate-(meth)acrylonitrile-(meth)acrylate ester copolymer, partially esterified product of styrene-maleic anhydride copolymer, polyvinyl-p-hydroxybenzal, and alkali-soluble novolak-type phenolic resin. These resins may be used alone or in combination with one another.

The transparent resin layer should be 0.1 μm to 5 μm in thickness (after drying). With a thickness smaller than 0.1 μm, the transparent resin layer hardly prevents base fogging. With a thickness greater than 5 μm, the transparent resin layer permits development more than necessary, with the result that fine lines are undesirably dropped out.

According to the present invention, the colored resin layer is composed of a binder resin and a coloring agent. The binder resin is a film-forming resin soluble in or readily swellable by the first and second developing solutions. Examples of such a resin include hydroxypropyl methylcellulose phthalate, methyl vinyl ether-maleic anhydride ester copolymer, polyvinyl pyrrolidone-vinyl acetate copolymer, dimethylamino-modified polyamide, (meth)acrylic acid-(meth)acrylate ester copolymer, (meth)acrylic acid-2-hydroxyethyl (meth)acrylate-(meth)acrylonitrile-(meth)acrylate ester copolymer, partially esterified product of styrene-maleic anhydride copolymer, polyvinyl butyral, polyvinyl-p-hydroxybenzal, and alkali-soluble novolak-type phenolic resin. These resins may be used alone or in combination with one another.

The coloring agent used for the colored resin layer is selected from pigments rather than dyes, because the former is less liable to base fogging. Any known inorganic and organic pigment may be usable in the present invention. However, organic pigments containing a less amount of heavy metals are preferable to inorganic ones from the standpoint of waste liquid treatment, because the colored resin layer exposed to active rays is dissolved in the developing solutions and washing water which have to be properly treated before discharging.

Examples of the organic pigment include known azopigments and phthalocyanine pigments. These pigments may be used alone or in combination with one another so that the colored resin layer assumes a red color, sepia color, green color, or blue color as desired. A preferred color pigment is one which gives rise to a high optical density per unit weight added. Pigments for the colored resin layer or black color include carbon black, graphite powder, nickel powder, and titanium black. Preferable among them is carbon black, which gives rise to a high optical density per unit weight added.

The following are commercial pigments that can be used for individual colors.

Black:
Carbon black #40, MA-100 (made by Mitsubishi Kasei)
Printex 55, 90 (made by Degussa)
Red:
Seikafast red 1547 (made by Dainichi Seika)
Seikafast carmine 3840 (made by Dainich Seika)
Pariogen red K3580 (made by BASF)
Pariogen red L3530 (made by BASF)
Sepia:
Transoxide red (made by Hilton-Davis)
Sicotrans red L27150D (made by BASF)
Green:
Phthalocyanine green 6YS (made by Sanyo Shikiso)
Heliogen green 6G (made by BASF)
Blue:
Cyanine blue 5060 (made by Dainichi Seika)
Heliogen blue D7100 (made by BASF)

The colored resin layer should be 0.3 μm to 15 μm, preferably 0.5 μm to 5 μm, in thickness (after drying). With a thickness smaller than 0.3 μm, the colored resin layer does not give rise to an adequate uniform optical density and the colored resin layer is liable to pinholes. With a thickness greater than 15 μm, the colored resin layer does not produce a colored relief image of high resolution after development.

The colored resin layer should be composed of the binder resin in an amount of 100 parts by weight and the coloring agent in an amount of 10-300 parts by weight, preferably 30-150 parts by weight, so that it gives rise to an adequate optical density for each color according to the layer thickness. The colored resin layer specified as above provides a good resolution after development according to the process of the present invention.

According to the present invention, the photo-sensitive resin layer is composed of a binder resin, which is a film-forming resin soluble in or readily swellable by the first developing solution, and an o-naphthoquinone diazide compound. Examples of such a resin include alkali-soluble novolak-type phenolic resin and styrene-maleic acid copolymer. For the improvement of developing performance and film flexibility, it may be used in combination with one or more polymers selected from hydroxypropyl methyl cellulose compound, methyl vinyl ether-maleic ester copolymer, polyvinyl pyrrolidone-vinyl acetate copolymer, alcohol-soluble polyamide, polyvinyl butyral, and polyvinyl-p-hydroxybenzal.

The o-naphthaoquinone diazide compound is a photo-sensitive substance which, upon exposure to active rays, forms an alkali-soluble five-membered cyclic compound having a carboxyl group. A preferred photosensitive substance in the photosensitive resin layer is an esterified reaction product of an o-naphthoquinone diazide derivative (such as o-naphthoquinone diazide-4-sulfonic acid or o-naphthoquinone diazide-5-sulfonic acid) with novolak-type phenolic resin, novolak-type m-cresol resin, novolak-type p-cresol resin, bisphenol S, bisphenol A, or bispyrogallol.

The esterified reaction product of o-naphthoquinone diazide should be used in an amount of 5-200 parts by weight, preferably 10-50 parts by weight, for 100 parts by weight the binder resin, so that the resulting image-forming material has an adequate printing sensitivity (lower than 200 mJ/cm$^2$) and developing speed (shorter than 2 minutes) required for second originals. The photo-sensitive resin layer should be 0.5 μm to 10 μm, preferably 1 μm to 5 μm, in thickness (after drying), so that the resulting image-forming material has an adequate printing sensitivity, developing speed, and resolving powder (higher than 20 lines/mm) required for second originals, without the possibility of causing pinholes in the image.

The image-forming material of the present invention is prepared by coating the roughened plastics film substrate with the above-mentioned transparent resin layer, colored resin layer, and photosensitive resin layer formed one over another. To form each layer, the binder resin is dissolved in a solvent and necessary components are added to the solution, and the resulting solution is applied, followed by drying, to give a desired coating thickness. The solvent for the binder resin includes distilled water, alkaline aqueous solutions, and organic solvents such as hydrocarbons, halogenated hydrocarbons, alcohols, ethers, acetals, ketones, esters, polyhydric alcohols and derivatives thereof, fatty acids, phenols, and nitrogen compounds. When necessary components are added to the binder resin solution, their dispersion may be promoted by the aid of any known dispersing means such as ball mill, sand grinder, attritor, roll mill, and high-speed impeller. The coating of each layer on the roughened plastics film substrate may be accomplished by any of the rod coating method, knife coating method, reverse roll coating method, gravure coating method, and kiss roll coating method. The wet coating is subsequently dried by blowing hot air (50° C. to 150° C.). The above-mentioned steps are repeated to form the image-forming material of the present invention.

The image-forming material of the present invention which is prepared as mentioned above is used in the following manner to produce an image on it. According to the process of the present invention, the image-forming material is exposed to active rays and then developed with specific developing solutions, so that the transparent resin layer, colored resin layer, and photosensitive resin layer which have been exposed are completely removed by dissolution or swelling. The exposure and subsequent development give rise to a colored positive relief image on the substrate.

The active rays are those which efficiently bring about the photochemical reaction of the esterified product of o-naphthoquinone azide contained in the photosensitive resin layer. To be specific, they are light having a wavelength of 300 nm to 500 nm. Such light is obtained by a light source such as carbon arc lamp, extra-high pressure mercury lamp, metal halide lamp, and micro-wave excited electrodeless lamp.

According to the process of the present invention, two developing solutions are used, a first developing solution having a higher pH value and a second developing solution having a lower pH value.

The first developing solution is an alkaline aqueous solution having a pH value of 10.0 or above. It contains one or more alkaline substances such as sodium hydroxide, potassium hydroxide, sodium silicate, sodium carbonate, trisodium phosphate, and triethanolamine. It also contains an organic solvent and/or anionic surface active agent which are miscible with said alkaline aqueous solution.

Examples of the organic solvent include alcohols and polyhydric alcohol derivative, such as isopropyl alcohol, benzyl alcohol, phenylcellosolve, and butyl cellosolve. The amount of the organic solvent should be less than 10 parts by weight, preferably less than 5 parts by weight, for 100 parts by weight of said alkaline aqueous solution.

Examples of the anionic surface active agent include alkylsulfate ester salt, alkylbenzenesulfonate salt, alkylnaphthalenesulfonate salt, and dialkylsulfosuccinate salt. Typical examples that can be used are sodium lauryl sulfate, sodium dodecylbenzenesulfonate, and isopropylnaphthalenesulfonate. The amount of the anionic surface active agent should be less than 20 parts by weight, preferably less than 10 parts by weight, for 100 parts by weight of said alkaline aqueous solution. The anionic surface active agent may be used alone or in combination with said organic solvent.

The second developing solution is an aqueous solution having a pH value lower than 10.0, it contains no alkaline substances but contains any of said organic solvents and anionic surface active agents in the same amount as in the case of the first developing solution. Incidentally, both the first and second developing solutions may contains an anti-forming agent such as silicone emulsion, if necessary.

The first and second developing solutions contain no dyes and hence are substantially colorless, because they do not need to color the relief image in the course of development.

According to the process of the present invention, the image-forming material of the present invention is developed by dipping it in the first developing solution and the second developing solution consecutively for 5 seconds to 3 minutes each. The developing solutions should be kept at 10° C. to 50° C., preferably 20° C. to 40° C. The developing speed may be properly controlled by rubbing the image-forming material in the developing bath or by washing the image-forming material with tap water when it is transferred from the first developing solution to the second one.

As the result of development, the exposed parts of the transparent resin layer, colored resin layer, and photosensitive resin layer are completely removed, with the result that the unexposed parts form the colored relief image and the surface of the roughened plastics film appears where there were the exposed parts.

What is obtained after development is the roughened plastics film which is free of base fogging and receptive to retouching ink because the transparent resin layer is completely removed from the surface of the roughened plastics film.

EXAMPLES

The invention will be described in more detail with reference to the following examples.

EXAMPLE 1

A 100-μm thick transparent polyethylene terephthalate film (as a substrate) was roughened by sand blasting so that its surface has the Arithmetical mean deviation of 0.70 μm. The roughened surface underwent corona discharge treatment. To the roughened surface was applied the coating solution of the transparent resin layer (explained below) using a wire bar, followed by drying with hot air at 90° C. for 2 minutes. Thus there was formed the transparent resin layer (0.5 μm thick) on the roughened surface of the substrate. Subsequently, on the transparent resin layer was formed the colored resin layer (1.5 μm thick) from the coating solution (explained below) in the same manner as mentioned above. Finally, on the colored resin layer was formed the photosensitive resin layer (1.0 μm thick) from the coating solution (explained below) in the same manner as mentioned above.

| Coating solution for transparent resin layer | |
|---|---|
| Acrylic acid-methacrylic ester copolymer ("SR-102" made by Go-ou Kagaku) | 10 pbw |
| Ethyl alcohol | 60 pbw |
| Coating solution for colored resin layer | |
| Carbon black ("MA-100" made by Mitsubishi Kasei) | 2 pbw |
| Acrylic acid-methacrylic ester copolymer (methyl methacrylate = 30 mol %, 2-hydroxyethyl methacrylate = 40 mol %, methacrylonitrile = 27 mol %, and methacrylic acid = 3 mol %) | 4 pbw |
| Distilled water | 80 pbw |
| 28% ammonia water | 1 pbw |
| Silicone surface active agent ("FS-XB-2725" made by Dow Corning) | 1 pbw |
| Coating solution for photosensitive resin layer | |
| Esterified product of o-naphthoquinone diazide 4-sulfonic acid and novolak-type henolic resin ("NQ-63" made by Respe Kagaku) | 1 pbw |
| Alkali-soluble novolak-type phenolic resin ("Resitop PSF-2803" made by Gunei Kagaku) | 3 pbw |
| Hydroxypropyl methylcellulose acetatesuccinate ("AS-55" made by Shin-Etsu Kagaku) | 1 pbw |
| Cellosolve acetate | 60 pbw |

EXAMPLE 2

An image-forming material pertaining to the present invention was prepared in the same manner as in Example 1 except that the roughened plastics film (roughened by sand blasting) was replaced by "Microtrace #400 HPB" (made by Kimoto), which is a 120-μm thick roughened plastics film with the Arithmetical mean deviation of 0.9 μm, formed by the surface coating method.

EXAMPLES 3 TO 6

Image-forming materials pertaining to the present invention were prepared in the same manner as in Example 2 except that the coating solution for the colored resin layer was replaced by the one which contains the coloring agent as shown in Table 1.

TABLE 1

| Example No. | Coloring agent | Color |
| --- | --- | --- |
| Example 3 | Seikafast carmine 3840 (made by Dainichi Seika) | Red |
| Example 4 | Transoxide red (made by Hilton-Davis) | Sepia |
| Example 5 | Phthalocyanine green 6YS (made by Sanyo Shikiso) | Green |
| Example 6 | Cyanine blue 5060 (made by Dainichi Seika) | Blue |

EXAMPLES 7 AND 8

Image-forming materials pertaining to the present invention were prepared in the same manner as in Example 2 except that the coating solutions for the transparent resin layer was replaced by the following ones.

| Coating solution for transparent resin layer (Example 7) | |
| --- | --- |
| Polyvinyl-p-hydroxybenzal | 2 pbw |
| Methyl cellosolve | 30 pbw |
| Ethyl alcohol | 26 pbw |
| Coating solution for transparent resin layer (Example 8) | |
| Partially esterified product of styrene-maleic anhydride copolymer ("Styrite CM-2L" made by Daido Kogyo) | 2 pbw |
| Methyl cellosolve | 30 pbw |
| Ethyl alcohol | 26 pbw |

COMPARATIVE EXAMPLE 1

An image-forming material for comparison was prepared in the same manner as in Example 1 except that the transparent resin layer was not formed.

COMPARATIVE EXAMPLE 2

An image-forming material for comparison was prepared in the same manner as in Example 1 except that the coating solution for the transparent resin layer was replaced by the following one.

| Coating solution for transparent resin layer | |
| --- | --- |
| Vinylidene chloride resin ("Kurehalon SOA" made by Kureha Kagaku) | 4 pbw |
| Ethyl acetate | 20 pbw |
| Toluene | 20 pbw |

COMPARATIVE EXAMPLE 3

An image-forming material for comparison was prepared in the following manner. A roughened plastics film substrate (roughened by sand blasting), which is identical with that used in Example 1, was subjected to corona discharge treatment. The treated substrate was coated with a coating solution for the photosensitive colored resin layer (specified below) using a wire bar, followed by drying with hot air at 90° C. for 2 minutes, to give a 2.5-μm thick layer.

| Coating solution for photosensitive colored resin layer | |
| --- | --- |
| Carbon black ("MA-100" made by Mitsubishi Kasei) | 2 pbw |
| Esterified product of o-naphthoquinone diazide 4-sulfonic acid and novolak-type phenolic resin ("NQ-63" made by Respe Kagaku) | 1 pbw |
| Alkali-soluble novolak-tupe phenolic resin ("Resitop PSF-2803" made by Gunei Kagaku) | 3 pbw |
| Hydroxypropyl methylcellulose acetatesuccinate ("AS-55" made by Shin-Etsu Kagaku) | 1 pbw |
| Methyl cellosolve | 50 pbw |
| Silicone surface active agent ("FS-XB-2725" made by Dow Corning) | 1 pbw |

The image-forming materials obtained in Examples 1 to 8 and Comparative Examples 1 to 3 were exposed for 15 seconds to light from an extra-high pressure mercury lamp (2 kW) placed 1 meter away. After exposure, they underwent development under the following conditions so that a positive colored relief image was formed on the roughened plastics film substrate. The performance of the relief image is shown in Table 2.

| Developing process | |
| --- | --- |
| Dipping in the 1st developing solution: | 30 sec (30° C.) |
| Washing with tap water: | 10 sec (20° C.) |
| Dipping in the 2nd developing solution: | 30 sec (30° C.) |
| Washing with tap water: | 10 sec (20° C.) |
| Drying | |
| Composition of the 1st developing solution | |
| Distilled water | 200 pbw |
| Trisodium phosphate ($Na_3PO_4 \cdot 12H_2O$) | 8 pbw |
| Solution of sodium alkylnaphthalenesulfonate ("Pelex NBL" made by Kao Co., Ltd.) | 10 pbw |
| Benzyl alcohol | 0.5 pbw |
| Composition of the 2nd developing solution | |
| Distilled Water | 200 pbw |
| Solution of sodium alkylnaphthalenesulfonate ("Pelex NBL" made by Kao Co., Ltd.) | 20 pbw |

TABLE 2

| Example No. (Comparative Example No.) | Color | Optical density of image | Optical density of non-image | Resolution/ mm | Retouchability with a pencil | Retouchability with oil-based ink | Retouchability with aqueous ink | Solvent resistance of non-image parts |
| --- | --- | --- | --- | --- | --- | --- | --- | --- |
| 1 | Black | 2.36 | 0.18 | >20 lines | fair | good | good | good |
| 2 | Black | >3.50 | 0.25 | >20 lines | good | good | good | good |
| 3 | Red | 0.78 | 0.25 | >20 lines | good | good | good | good |
| 4 | Sepia | 1.80 | 0.25 | >20 lines | good | good | good | good |
| 5 | Green | 1.20 | 0.25 | >20 lines | good | good | good | good |
| 6 | Blue | 1.24 | 0.25 | >20 lines | good | good | good | good |
| 7 | Black | >3.50 | 0.25 | >20 lines | good | good | good | good |
| 8 | Black | >3.50 | 0.25 | >20 lines | good | good | good | good |
| (1) | Black | 2.01 | 0.25 | >20 lines | poor | poor | poor | good |
| (2) | Black | >3.50 | 0.50 | <10 lines | bad | bad | bad | bad |
| (3) | Black | >3.50 | >3.50 | none | bad | bad | bad | — |

Remarks:
(1) Optical density was measured using a Macbeth optical densitometer (TD-904) through a UV filter after re-exposure.
(2) Retouchability was evaluated by using a drawing instrument.
(3) Solvent resistance of non-image parts was evaluated by rubbing non-image parts with absorbent cotton containing methyl ethyl ketone.

As demonstrated in the examples, the image-forming material of the present invention can be developed with developing solutions containing no dye solution. Therefore, it forms on the roughened plastics film substrate a colored positive relief image having a specific optical density and a high resolution.

In addition, the image-forming material of the present invention has a high printing sensitivity because it has the photosensitive resin layer containing no coloring components and has the colored resin layer under the photosensitive resin layer.

Moreover, the image-forming material of the present invention has the transparent resin layer interposed between the colored resin layer and the roughened plastics film substrate. This structure eliminates base fogging. Non-image parts permit the roughened plastics film substrate to show its original surface which has good solvent resistance and retouchability.

As mentioned above, the present invention provides a very good second original which is useful in the field of designing and drawing.

Thus there is provided in accordance with the invention an image-forming material and process for forming images which have the advantages discussed above. The embodiments described are intended to be merely exemplary and those skilled in the art will be able to make variations and modifications in them without departing from the spirit and scope of the invention. All such modifications and variations are contemplated as falling within the scope of the claims.

What is claimed is:

1. An image-forming material comprising, in succession:
   a plastic film substrate having one surface roughened to an arithmetic mean deviation of 0.25–1.25 microns to provide a writing surface receptive to pencil and ink;
   a transparent resin layer formed on said writing surface and containing at least one resin selected from the group consisting of (meth)acrylic acid and (meth)acrylic ester copolymers, partially esterified products of styrene-maleic anhydride copolymers and hydroxybenzaldehyde-modified polyvinyl alcohols, said one resin being insoluble in distilled water but soluble in or swellable by an aqueous solution having a pH value 10.0 or above;
   a colored resin layer formed on said transparent resin layer; and
   an alkali-developable, positive-working photosensitive resin layer formed on said colored resin layer;
   wherein, upon exposure of said image-forming material, exposed portions of said transparent resin layer, said colored resin layer and said positive-working photosensitive resin layer are completely removable by development to bare said plastic film substrate in said exposed portions.

2. An image-forming material as claimed in claim 1, wherein the photosensitive resin layer contains an o-naphthoquinone diazide compound.

3. An image-forming material as claimed in claim 1 wherein the colored resin layer contains a color pigment which causes the colored resin layer to assume any color of black, red, sepia, green, and blue.

4. An image-forming material as claimed in claim 2, wherein the colored resin layer contains a color pigment which causes the colored resin layer to assume any color of black, red, sepia, green, and blue.

5. The image-forming material of claim 1 wherein said exposed portions of said layers are completely removable by development comprising a treatment with an aqueous alkali solution.

* * * * *